United States Patent
Praiswater

Patent Number: 5,838,294
Date of Patent: Nov. 17, 1998

[54] VERY LOW DUTY CYCLE PULSE WIDTH MODULATOR

[75] Inventor: Michael Ross Praiswater, Albuquerque, N. Mex.

[73] Assignee: Honeywell Inc., Minneapolis, Minn.

[21] Appl. No.: 760,548

[22] Filed: Dec. 15, 1996

[51] Int. Cl.⁶ .................................................. G09G 3/36
[52] U.S. Cl. ........................ 345/102; 345/148; 345/211
[58] Field of Search ............................. 345/102, 87, 47, 345/50, 75, 77, 148, 89, 211, 212, 147, 213; 315/158, 194, 291, 307

[56] References Cited

U.S. PATENT DOCUMENTS

| | | | |
|---|---|---|---|
| 3,440,566 | 4/1969 | Swanson | 332/9 |
| 3,604,995 | 9/1971 | Als et al. | 318/341 |
| 4,482,844 | 11/1984 | Schweer et al. | 315/194 |
| 4,614,415 | 9/1986 | Hyatt | 345/150 |
| 4,998,045 | 3/1991 | Ruby | 315/209 R |
| 5,027,034 | 6/1991 | Ruby et al. | 315/106 |
| 5,105,127 | 4/1992 | Lavand et al. | 315/291 |
| 5,184,117 | 2/1993 | Gauthier | 345/102 |
| 5,225,742 | 7/1993 | Beasley | 315/307 |
| 5,420,481 | 5/1995 | McCanney | 315/291 |
| 5,428,265 | 6/1995 | Booth, Jr. et al. | 315/158 |
| 5,606,296 | 2/1997 | Seong | 332/109 |

FOREIGN PATENT DOCUMENTS

0665485A1  2/1995  Germany .......................... G05F 3/26

*Primary Examiner*—Dennis-Doon Chow
*Attorney, Agent, or Firm*—Andrew A. Abeyta; Kenneth J. Johnson

[57] ABSTRACT

An apparatus which outputs very low duty cycle pulses of a consistent width. It is common to use a pulse width modulator as part of a liquid crystal display dimming system to vary the brightness. In the typical pulse width modulating scheme for lamp dimming, certain noise irregularities may appear at the beginning of a ramping voltage. These irregularities result in pulse widths which vary greatly. In the present invention, the slope of the ramping voltage is greatly increased at the beginning of the period, thus making the comparison between the reference voltage and the ramping voltage more accurate.

13 Claims, 4 Drawing Sheets

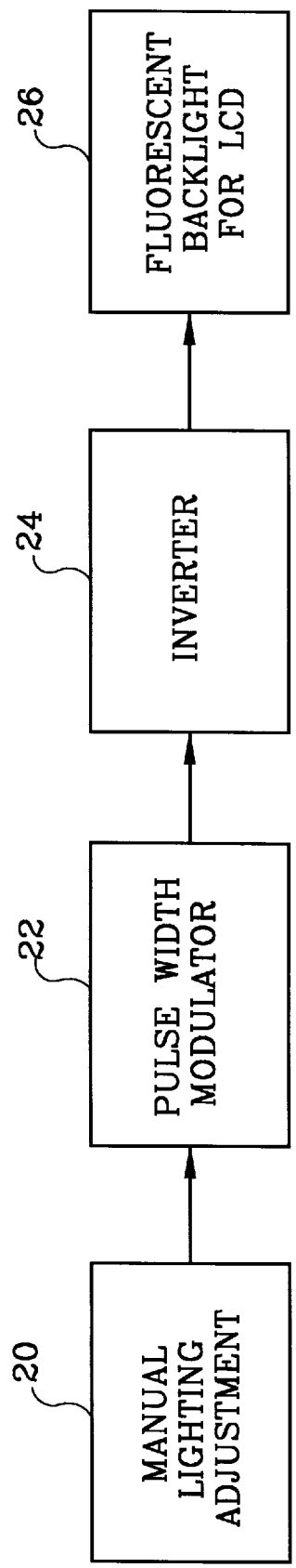

000
VERY LOW DUTY CYCLE PULSE WIDTH MODULATOR

The United States Government has acquired certain rights in this invention through Government Contract No. F33657-90-C-2233 awarded by the Department of the Air Force.

FIELD OF THE INVENTION

The invention is directed generally to a pulse width modulating apparatus, and more specifically to a pulse width modulating apparatus which outputs very low duty cycle pulses.

BACKGROUND OF THE INVENTION

In recent years, liquid crystal displays (LCDs) with backlights have been incorporated into the cockpits of all types of aircraft. The aircraft cockpit can be one of the most extreme environments in which a fluorescent lamp must operate. One aspect of the cockpit environment which requires a lot of a backlight, is the large dimming range. In some military environments, the dimming ratio can be somewhere near 10,000 to 1. These displays need a backlighting system to make information visible to the pilot under lighting conditions that may go from near blackness at night to direct sunlight on the display. Since it is also desired that the backlighting color not change over the dimming range, fluorescent lights are preferred since their color is not altered by dimming but rather by the selection of the appropriate composition of phosphorous coating within the lamp. Accordingly, the brightness of the fluorescent lamp needs to vary by large amount in order for the pilot to be able to view the display under all ambient lighting conditions. The system should be free of swirls, flicker, and discontinuities and be capable of withstanding temperatures from −55° C. to +85° C. with a smooth response to the pilot's dimming command and be able to provide a large number of cold starts and hours of operation while maintaining a high efficiency circuit.

One scheme for dimming a fluorescent lamp is a system in which the alternating signal supplying power to the lamp is cut with a notch of variable width so as to reduce the power applied to the lamp and thereby provide the desired dimming. The smaller the widths provided to the lamp, the lower power at which the lamp operates. A common device for providing the ability to vary the width of the pulses are commercially available pulse width modulators. The basic operation of these pulse width modulators is as follows: A reference voltage is transmitted to the pulse width modulator. The magnitude of the reference voltage is proportional to the desired width of the pulses. Inside the pulse width modulator, means are provided to generate another voltage which ramps at a known rate, for a known period of time. The reference voltage is compared to the ramping voltage and the pulse width is generated based on the amount of time the reference voltage is greater than the ramping voltage.

A disadvantage of the system described above is that during the times when very low power is provided to the backlight and the pulses are narrow, there may be a problem with flicker. Because of electronic noise which may occur while charging the capacitor or small variations in the voltage level at very low pulse widths, certain inconsistencies may make themselves apparent. This problem becomes clearer by looking at the graphs in FIGS. 1A and 1B. FIG. 1A shows the comparison of the ramping voltage to the reference voltage within the pulse width modulator as well as the resulting pulse which is output. In the example in FIG. 1A, the reference voltage is at a medium level and the point at which the ramping voltage becomes greater than the reference voltage is clear and consistent. However, in the situations where narrow pulses are desired, and the reference voltage is at a low magnitude, certain inconsistencies may appear. In FIG. 1B these potential problems are made apparent. At the point where the capacitor begins to charge for the ramping voltage, the initial charging may not be linear. There may be a small curve on the end of this ramp. If this happens, the pulse width may be either too wide or too narrow. Because this noise may fluctuate over time, the output pulses will also vary in width over time. These variations in width will cause flicker which will appear on the display screen.

Therefore, an object of the present invention is to provide an apparatus which eliminates inconsistent pulse widths when the pulse width modulator is operating at a very low duty cycle.

SUMMARY OF THE INVENTION

The apparatus described herein provides consistent pulse widths for a pulse width modulator when operating at a very low duty cycle. The apparatus is comprised of a pulse width modulating apparatus which outputs pulses on a periodic basis where the width of the pulses is controlled by the magnitude of an input voltage. In electrical contact with the pulse width modulator is a timing capacitor which receives a charging current from the pulse width modulator and provides the ramping voltage which is compared to the input voltage. The magnitude of the charging current controls the rate at which the capacitor charges. Also, externally connected to the pulse width modulator is a timing resistor which is connected between the pulse width modulator and ground. The current output used to charge the timing capacitor is a function of the current flow through the timing resistor. Also connected externally to the pulse width modulator is a circuit which for a predetermined period of time increases the current from the pulse width modulator through the timing resistor. This has the effect of also increasing the charging current. With a steeper ramping voltage on the external capacitor, a more accurate and consistent pulse width at low duty cycles is output.

The pulse width modulating apparatus described herein finds use as a dimmer for a LCD fluorescent backlight. Providing consistent pulse widths at a very low duty cycles eliminates flicker problems which are commonly associated with this type of dimming scheme when operating at low power.

BRIEF DESCRIPTION OF THE DRAWINGS

FIG. 2 shows the lighting system for a liquid crystal display fluorescent backlight.

DESCRIPTION OF THE PREFERRED EMBODIMENT

One embodiment for an aircraft lighting system is disclosed in FIG. 2. In this system, the pilot makes adjustments to the lighting of the display through the martial lighting adjustment 20. Manual lighting adjustment 20 outputs a voltage to pulse width modulator system 22 which is proportional to the desired amount of lighting. The pulse width modulator system 22 periodically outputs pulses to inverter 24, where the width of the pulses is a function of the manual adjustment voltage. The inverter 24 translates the pulses into an AC signal which is used to power the fluorescent backlight 26.

Displays which are used in aircraft cockpits are required to work under some very extreme conditions. The lighting in the cockpit may vary from pitch black at night to sunlight shining directly on the display. As such, a display which operates in this environment must have an extremely high dimming ratio. When a display is operating at very low power output, there must be no flickering of the display. The invention described herein discloses a pulse width modulator which may be used in a dimming system where the pulse width modulator is able to operate at a very low duty cycle.

Figure 3:
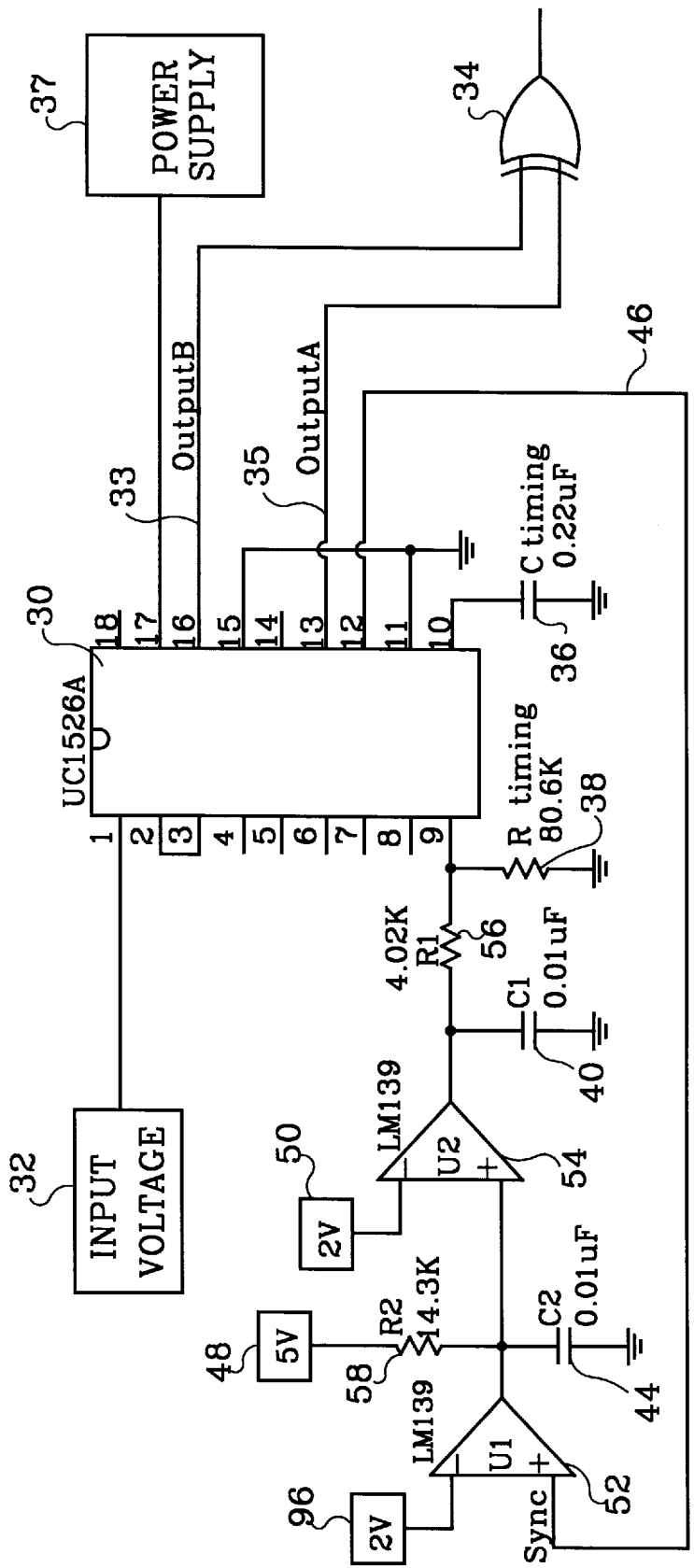
FIG. 3 shows the preferred embodiment of the present invention.

Disclosed in FIG. 3 is a detailed system diagram for the pulse width modulator system 22. Pulse width modulator circuit 30 in the preferred embodiment is a model SGI 526 of Linfinity, Inc. of 11861 Western Avenue, Garden Grove, Calif. 92641. Most commercial and custom pulse width modulators operate in a manner similar to the SG1526, and the enhancement circuit described herein can be used with most of these pulse width modulators. The pulse width modulator circuit 30 receives an input voltage 32 on pin 1 which is the signal output from the manual lighting adjustment 20. Power for the circuit is provided by power supply 37 on pin 17. The pulses output by the pulse width modulator are alternately transmitted over lines 33 and 35 to OR gate 34. So that the user may control the operating characteristics of the pulse width modulator circuit 30, two external exponents, the timing resistor 38 on pin 9 and timing capacitor 36 on pin 10 are provided.

Figure 1A:
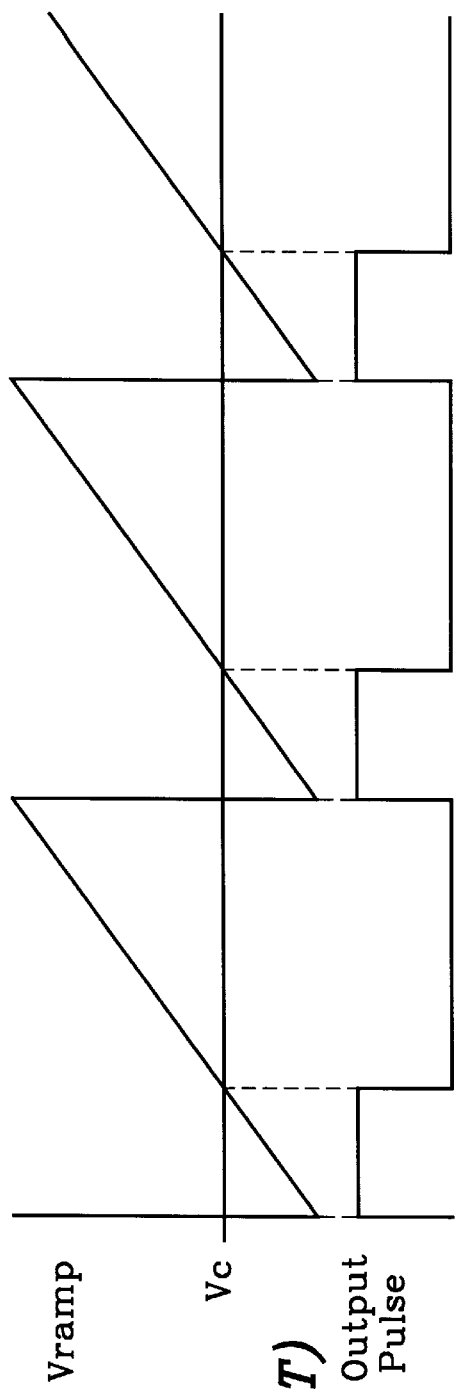
FIGS. 1A and 1B show the output of prior art pulse width modulators.
Figure 1B:
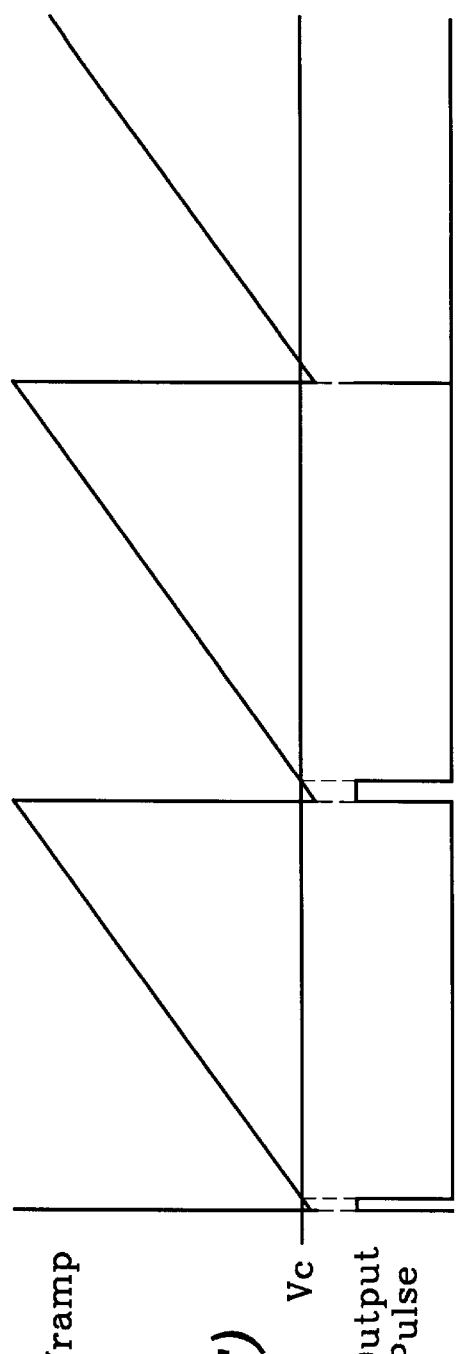

In pulse width modulator circuit 30, output pulses can be varied in width according to the input voltage. The pulses which are output at regular intervals, can fill a whole period or be a small fraction of it. In order to generate a pulse, a comparison is made between the charge that is built up on the timing capacitor 36 and the input voltage 32. Timing capacitor 36 is provided with a constant current so that the charge builds in a linear manner. In the present configuration, the amount of time that the pulse width is at a high level is a function of the period of time in which the charge on the timing capacitor 36 is less than input voltage 32. This comparison can be seen very clearly in FIGS. 1A and 1B. The slope of the ramping voltage is constant and the width of the pulse is dependent on the magnitude of the voltage which is input to the pulse width modulator. The higher the voltage, the larger the width of the pulse.

The rate at which a capacitor is charged can be controlled by the user of the pulse width modulator circuit 30. This is done with timing resistor 38. A voltage is output from pin 9 of the pulse width modulator through timing resistor 38 to ground. The magnitude of the current exiting pin 9 can be changed by changing the value of the timing resistor. The precision current which is output from pin 10 through the timing capacitor 36 is a function of the current output from pin 9. By changing timing resistor 38, the rate at which the timing capacitor 36 is charged is changed.

The remainder of the circuit in FIG. 3 is as follows: A sync signal is output on line 46 to comparator 52. Also input into the comparator is voltage source 96. The output of comparator 52 is in electrical contact with resistor 58, capacitor 44, as well as one of the inputs of comparator 54. Also input into comparator 54 is voltage source 50. The output of comparator 54 is in contact with the anode of capacitor 40 and resistor 56.

A disadvantage of pulse width modulator circuit 30 is that it does not output accurate pulses when operating at very low duty cycles. This is shown clearly in FIG. 1B. Different types of electronic noise can affect the shape of the ramping voltage built up on capacitor 36; especially a beginning and end of the ramp waveform. These irregularities affect the shape of the pulse at very low duty cycles. The width of the pulses in FIG. 1B vary greatly from period to period, thus affecting the brightness of the LCD backlight and causing the display to flicker. The purpose of the additional circuitry in FIG. 3 is to provide pulses of a consistent width at very low duty cycles.

Normally, timing resistor 38 and timing capacitor 36 are used to set the internal clock frequency of the pulse width modulator. The additional components, resistor 56, resistor 58, capacitors 40 and 44, and comparators 52 and 54, are used to shape the ramp wave form created by the pulse width modulator on pin 10. The pulse width modulator sync signal which is output over line 46 pulses at the operating frequency of the internal clock of the pulse width modulator circuit 30. At the beginning of the sync pulse, a switch inside the pulse width modulator closes and capacitor 36 discharges to the minimum voltage of the waveform. When the sync pulse changes to the high state, the timing capacitor charges to the maximum voltage of the ramp waveform through a current source that is internal to the pulse width modulator. The amplitude of the current source that drives capacitor 36 is controlled by the value of resistor 38. A large value of resistor 38 yields a low amplitude current source and a slow charge rate for capacitor 36.

When the pulse width modulator outputs the sync signal, comparator 52 senses the beginning of the sync pulse and discharges capacitor 44 through the low impedance output. Comparator 52 holds capacitor 44 close to ground potential through the duration of the sync pulse. As long as the non-inverting input of comparator 54 is less than voltage source 50, the output of comparator 54 discharges capacitor 40 and pulls resistor 56 to ground. When the left side of resistor 56 is grounded, the resistance from the timing resistor input of the pulse width modulator to ground is equal to the parallel combination of resistor 56 and timing resistor 38. The lower pulse width modulating timing resistance results in an increased charge rate for timing capacitor 36 and an increased slope on the ramp waveform. At the end of the sync pulse, the comparator 52 output goes to a high impedance state and capacitor 44 charges up to 5 volts from voltage source 48 through resistor 58. The charge rate for capacitor 44 is controlled by the RC time constant created by resistor 58 and capacitor 44. After approximately 100 microseconds, the voltage across capacitor 44 reaches 2 volts and the output of comparator 54 goes to the high impedance state, disconnecting resistor 56 from ground. With the parallel connection between resistor 56 and timing resistor 38 broken, the slope of the ramp waveform is controlled again by timing resistor 38 and timing capacitor 46 for the remainder of the period. Capacitor 40 is used to smooth the transition from the steep slope to the normal slope in the ramp waveform.

Figure 4:
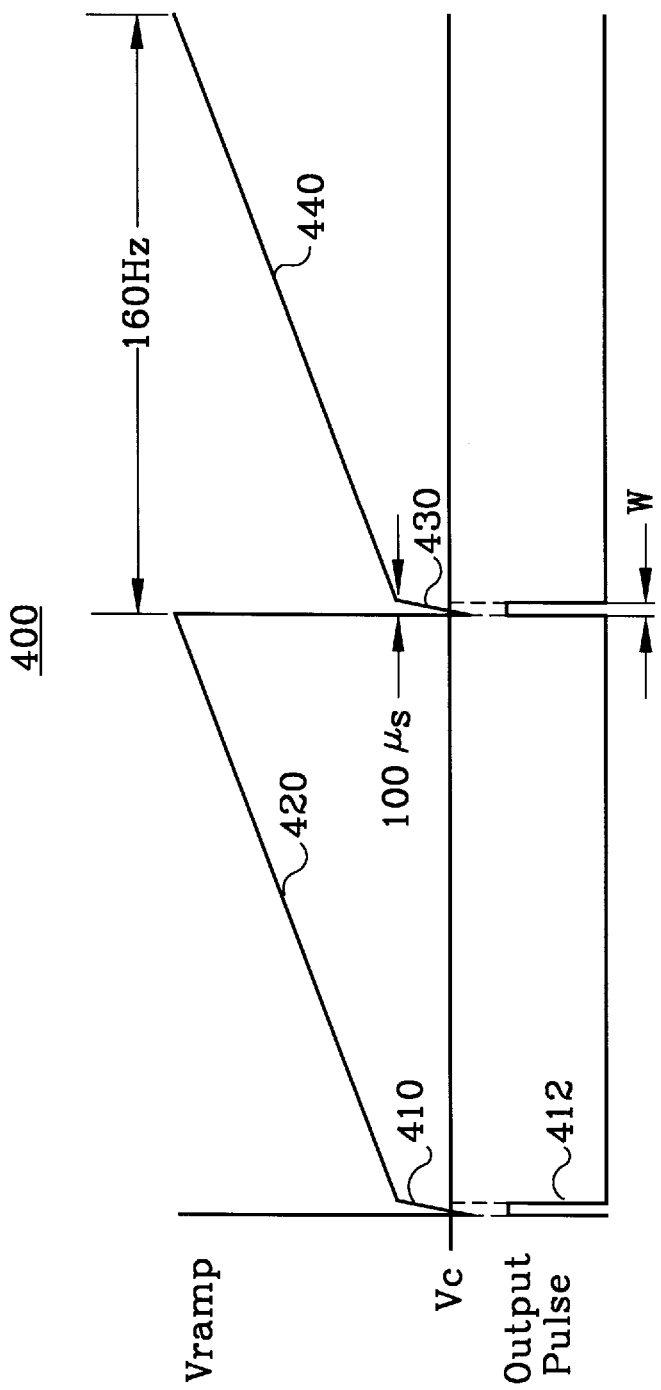
FIG. 4 shows graphs of the output of the preferred embodiment.

The performance of the modified pulse width modulator is shown in FIG. 4. In this graph 400, the charge $V_{RAMP}$ on the timing capacitor 36 is shown with reference to the input voltage 32, which is designated as $V_c$ in graph 400. In this graph 400, it is obvious that the slope of the charging voltage $V_{RAMP}$ is very steep at the beginning of the period (see slope 410 and 430) and then flattens out for the remainder (see slopes 420 and 400). These steep slope, 410 and 430, occur at the beginning of each period for a known period of time after the sync pulse is transmitted over line 46 to comparator 52. As can be seen in FIG. 4, the output pulses 412 and 432, which are output from the pulse width modulator 30, are of a consistent width w at a very low duty cycle. If this circuit 30 is used in a display, this will eliminate any flicker due to inconsistent pulse width at low dimming ranges for the displays. Using this technique, the output pulse is consistent at widths less than one microsecond.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. An apparatus for generating very low/duty cycle pulses for controlling the dimming of a fluorescent lamp comprising:
    a pulse width modulating means which outputs pulses on a periodic basis, where the width of the pulses is controlled by the magnitude of an input voltage, said pulse width modulating means further comprising:
        means for generating a sync pulse at predetermined intervals;
        a timing resistor connected between a voltage source and ground where a reference current is drawn through the timing resistor; and
        a timing capacitor which receives a charging current, where said charging current is a function of the reference current, said timing capacitor provides a ramping voltage which is compared with the input voltage the ramping voltage being characterized by a waveform having at least two slopes; and
    means which receives the sync pulse from the pulse width modulating means and increases the current through the timing resistor which in turn increases the rate in which the timing capacitor charges for a period of time which is a function of the sync pulse.

2. The apparatus of claim 1 wherein the means to increase the current through the timing resistor comprises
    a first comparator which receives the sync pulse from the pulse width modulating means and compares the sync pulse to a reference voltage, where said first comparator outputs a low signal in response to the sync pulse being less than the first reference voltage and said first comparator outputs a high signal in response to the sync pulse being greater than the first reference voltage;
    a voltage source in contact with the output of the first comparator which charges a first capacitor through a resistor when the output of the first comparator is high and discharges said capacitor when the sync pulse is low; and
    a second comparator which compares the charge on the first capacitor with a second reference voltage and outputs a low signal in response to the charge on the capacitor being less than the second reference voltage, and outputs a high signal when the charge on the capacitor is greater than the second reference voltage where the output of the second comparator is in contact with the voltage source through a second resistor.

3. The apparatus of claim 2 wherein the second capacitor has an anode in contact with the output of the second comparator and a cathode in contact with ground.

4. The apparatus for generating very low duty cycle pulses of claim 1 wherein the apparatus for generating very low duty cycle pulses is used in a dimming circuit for a fluorescent light.

5. The apparatus of claim 4 wherein the fluorescent light is used as a liquid crystal display backlight.

6. A backlight apparatus for a liquid crystal display comprising:
    means for emitting light;
    power supply for providing power to the means for emitting light;
    means to control the brightness of the means for emitting light, said means comprising:
        a pulse width modulating means which outputs pulses on a periodic basis, where the width of the pulses is controlled by the magnitude of an input voltage, said pulse width modulating means further comprising:
            means for generating a sync pulse at predetermined intervals;
            a timing resistor connected between a voltage source and ground where a reference current is drawn through the timing resistor; and
            a timing capacitor which receives a charging current, where said charging current is a function of the reference current, said timing capacitor provides a ramping voltage which is compared with the input voltage, the ramping voltage being characterized by a waveform having at least two slopes; and
        means which receives the sync pulse from the pulse width modulating means and increases the current through the timing resistor which in turn increases the rate in which the timing capacitor charges for a period of time which is a function of the sync pulse.

7. The apparatus of claim 6 wherein the means to increase the current through the timing resistor comprises
    a first comparator which receives the sync pulse from the pulse width modulating means and compares the sync pulse to a reference voltage, where said first comparator outputs a low signal in response to the sync pulse being less than the first reference voltage and said first comparator outputs a high signal in response to the sync pulse being greater than the first reference voltage;
    a voltage source in contact with the output of the first comparator which charges a first capacitor through a first resistor when the output of the first comparator is high and discharges said capacitor when the sync pulse is low; and
    a second comparator which compares the charge on the first capacitor with a second reference voltage and outputs a low signal in response to the charge on the capacitor being less than the second reference voltage, and outputs a high signal when the charge on the first capacitor is greater than the second reference voltage where the output of the second comparator is in contact with the voltage source through a second resistor.

8. The apparatus of claim 7 wherein a second capacitor has an anode in contact with the output of the second comparator and a cathode in contact with ground.

9. The apparatus of claim 6 wherein the light emitting means is a fluorescent backlight.

10. An apparatus for adapting a pulse width modulator to output very low duty cycle pulses for controlling the dimming of a fluorescent lamp, wherein the pulse width modulator has external connections to a timing capacitor and a timing resistor, and the pulse width modulator receives an control voltage external voltage, apparatus comprising:

a first comparator which receives the sync signal from the pulse width modulating means and compares the sync signal to a reference voltage, where said first comparator outputs a low signal in response to the sync signal being less than the first reference voltage and said first comparator outputs a high impedance in response to the sync signal being greater than the first reference voltage;

a voltage source in contact, through a first resistor, with the output of the first comparator which charges a first capacitor when the output of the first comparator is high impedance and discharges said capacitor when the sync pulse is low; and a second comparator which compares the charge on the firs capacitor with a second reference voltage and outputs a low signal in response to the charge on the first capacitor being less than the second reference voltage, and outputs a high impedance when the charge on the capacitor is greater than the second reference voltage where the output of the second comparator is in contact with a second resistor.

11. The apparatus of claim 10 wherein the pulse width modulator is used as dimmer for a light emitting means.

12. The apparatus of claim 11 wherein the light emitting means is a fluorescent backlight for a liquid crystal display.

13. The apparatus of claim 10 wherein a second capacitor has an anode in contact with the output of the second comparator and a cathode in contact with ground.

* * * * *